US008710927B2

(12) United States Patent
Kamitani et al.

(10) Patent No.: US 8,710,927 B2
(45) Date of Patent: Apr. 29, 2014

(54) HIGH-FREQUENCY POWER AMPLIFIER (71) Applicant: Panasonic Corporation, Osaka (JP)

(72) Inventors: Masatoshi Kamitani, Osaka (JP);
Masahiro Maeda, Osaka (JP);
Katsuhiko Kawashima, Hyogo (JP);
Hiroshi Sugiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/929,792

(22) Filed: Jun. 28, 2013

(65) Prior Publication Data

US 2013/0285749 A1   Oct. 31, 2013

Related U.S. Application Data (63) Continuation of application No. PCT/JP2012/000250, filed on Jan. 18, 2012.

(30) Foreign Application Priority Data

Jan. 20, 2011 (JP) ................................. 2011-010018

(51) Int. Cl.
*H03F 3/193* (2006.01)
(52) U.S. Cl.
USPC .......................... 330/295; 330/124 R; 330/51
(58) Field of Classification Search
USPC ................. 330/295, 124 R, 286, 53, 84, 51
See application file for complete search history.

(56) References Cited

U.S. PATENT DOCUMENTS

| 5,256,987 | A | 10/1993 | Kibayashi et al. |
| 6,466,088 | B1 * | 10/2002 | Rezvani et al. ................. 330/51 |
| 7,538,609 | B2 * | 5/2009 | Itkin et al. ....................... 330/51 |
| 7,944,291 | B2 * | 5/2011 | Jung et al. ....................... 330/51 |
| 2004/0075503 | A1 | 4/2004 | Komatsu et al. |
| 2007/0222523 | A1 | 9/2007 | Arell |
| 2009/0207764 | A1 | 8/2009 | Fukamachi et al. |
| 2010/0033241 | A1 | 2/2010 | Mori et al. |

FOREIGN PATENT DOCUMENTS

| JP | 05-259765 | 10/1993 |
| JP | 2002-171196 | 6/2002 |
| JP | 2002-246848 | 8/2002 |
| JP | 2007-019585 | 1/2007 |
| WO | 2007/129716 | 11/2007 |

OTHER PUBLICATIONS

International Search Report of PCT Application No. PCT/JP2012/000250 dated Mar. 13, 2012.

* cited by examiner

*Primary Examiner* — Hieu Nguyen
(74) *Attorney, Agent, or Firm* — Panasonic Patent Center (57) ABSTRACT A high-frequency power amplifier that amplifies a high-frequency input signal and outputs a signal having one power selected from a plurality of powers includes a high output route that is a circuit, which amplifies the input signal and outputs a signal of a high power, and a medium output route that is a circuit, which amplifies the input signal and outputs a signal of a medium power. The high output route includes a high-output amplifier that amplifies the input signal, an output matching circuit that is connected to an output node of the high-output amplifier, and a switch element that is connected to an output node of the output matching circuit. The medium output route includes a medium-output amplifier that amplifies the input signal and a switch element that is connected between an output node of the medium-output amplifier and an output node of the output matching circuit.

19 Claims, 9 Drawing Sheets

HIGH-FREQUENCY POWER AMPLIFIER

BACKGROUND

1. Technical Field

The present invention relates to a high-frequency power amplifier and, particularly to a wide-band high-frequency power amplifier that is suitable for transmission of a mobile communication device including a mobile phone.

2. Background Art

In recent years, for mobile communication devices such as mobile phones, there is a strong demand for multiband in which a plurality of frequency bands are used because of reservation of a communication capacity and global roaming. Currently mainstream communication systems include a second generation system in which GSM (Global System for Mobile Communications) is adopted and a third generation system in which CDMA (Code Division Multiple Access) is adopted. Band I ranging from 1920 MHz to 1980 MHz, Band II ranging from 1850 MHz to 1910 MHz, Band III ranging from 1710 MHz to 1785 MHz, Band IV ranging from 1710 MHz to 1755 MHz, Band V ranging from 824 MHz to 849 MHz, Band VI ranging from 830 MHz to 840 MHz, Band VIII ranging from 880 MHz to 915 MHz, Band IX ranging from 1749.9 MHz to 1784.9 MHz, and Band XI ranging from 1427.9 MHz to 1452.9 MHz exist as the frequency band used in transmission of the communication systems. A combination of the communication system and a communication frequency differs in various regions where the mobile phone is used.

In such multiband mobile phones, in addition to downsizing of a battery, it is necessary that efficiency (power saving) of transmission power amplifier in which a power consumption ratio is high be improved in order to achieve downsizing, weight reduction, and prolonged talk. A GaAs high-frequency transistor excellent in a high-frequency characteristic and power conversion efficiency is mainly used as the transmission power amplifier for the mobile phone. The GaAs high-frequency transistor is roughly classified into a field effect transistor (hereinafter referred to as an FET) and a heterojunction bipolar transistor (hereinafter referred to as an HBT).

In CDMA systems such as W-CDMA, a technique of controlling the high-frequency power output from an antenna of the mobile terminal according to a distance to a base station or an ambient environment is used such that the high-frequency power reaching the base station is substantially equalized. Generally, the antenna output increases in the case that the mobile terminal is far from the base station, and the antenna output decreases in the case that the mobile terminal is close to the base station. The antenna output is performed by controlling the output of a PA (Power Amplifier) module (hereinafter referred to as a "high-frequency power amplifier"). Frequently the mobile terminal is used while the antenna output is suppressed to a relatively low level, and it is necessary to achieve the high efficiency of the high-frequency power amplifier in a low output condition in order to reduce the power consumption. However, the high-frequency power amplifier is designed such that power efficiency is maximized during high output. Therefore, the power efficiency is degraded in the output power below the high output.

Figure 9:
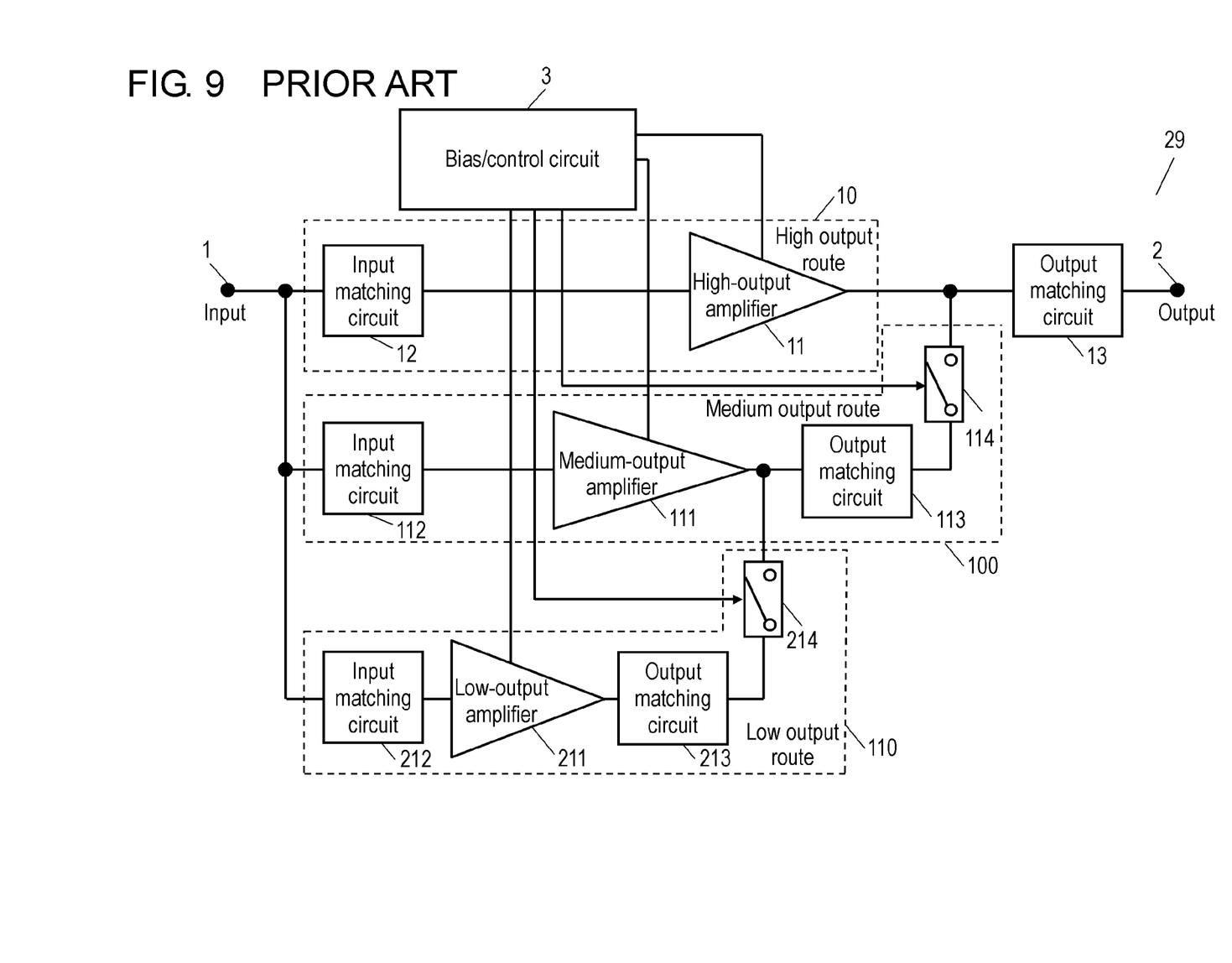
FIG. 9 is a block diagram of a high-frequency power amplifier of a conventional technology.

A high-frequency power amplifier that switches an output route used according to the required output power is proposed as a technology of improving the efficiency during medium output and low output (see U.S. Patent Publication No. 2007/0222523). FIG. 9 is a block diagram of high-frequency power amplifier 29 disclosed in U.S. Patent Publication No. 2007/0222523.

Conventional high-frequency power amplifier 29 will be described below with reference to FIG. 9. Note that, in the following description, the same element is designated by the same numeral. High-frequency power amplifier 29 includes input terminal 1, output terminal 2, bias/control circuit 3, high output route 10, medium output route 100, low output route 110, and output matching circuit 13.

An operation of high output route 10 will now be described. A high-frequency power signal input from input terminal 1 is input to high-output amplifier 11 through input matching circuit 12, and amplified. The high-frequency power signal amplified by high-output amplifier 11 is output from output terminal 2 through output matching circuit 13.

Next, the operation of medium output route 100 will be described. The high-frequency power signal input from input terminal 1 is input to medium-output amplifier 111 through input matching circuit 112. The high-frequency power signal amplified by medium-output amplifier 111 is output from output terminal 2 through output matching circuit 113, switch element 114, and output matching circuit 13.

Next, the operation of low output route 110 will be described. The high-frequency power signal input from input terminal 1 is input to low-output amplifier 211 through input matching circuit 212. The high-frequency power signal amplified by the low-output amplifier 211 is output from output terminal 2 through output matching circuit 213, switch element 214, output matching circuit 113, switch element 114, and output matching circuit 13 in turn. Which one of three output routes 10, 100, and 110 amplifies the high-frequency power signal input from input terminal 1 is determined by bias/control circuit 3, which performs control of a bias current to amplifiers 11, 111, and 211 and control of switch elements 114 and 214.

Thus, the conventional high-frequency power amplifier 29 switches the output route used according to the required output power.

SUMMARY

However, in the circuit configuration of the conventional high-frequency power amplifier 29, unfortunately it is necessary to provide output matching circuit 113 in medium output route 100 and output matching circuit 213 in low output route 110. That is, it is necessary to provide output matching circuit 113 and 213 in medium and low output routes 100 and 110 in order to optimize an output impedance in other output routes (medium and low output routes 100 and 110) according to the extremely low output impedance of high output route 10. At least two components are required in each of output matching circuits 113 and 213. Generally the high-frequency matching circuit is configured by an inductor or a capacitor. However, the frequency band of the high-frequency matching circuit is restricted because the inductor or the capacitor has a frequency characteristic. It is necessary to optimize a value of the inductor or capacitor according to the frequency. Therefore, in the multiband, it is necessary to provide a medium-output route or a low-output route in each band (that is, the matching circuit in each band). In the case that the matching circuit is configured by at least three components in order to widen the band, a circuit scale is further enlarged, and a loss also increases, which results in a problem in that the power efficiency is degraded.

The present invention has been devised in order to solve the above problem and an object thereof is to provide a high-frequency power amplifier that can output the signal having the power selected from the plurality of powers without enlarging the circuit scale.

In accordance with an aspect of the present invention, a high-frequency power amplifier amplifies a high-frequency input signal and outputs a signal having one power selected from a plurality of powers, the high-frequency power amplifier includes: a first output route that is a circuit, which amplifies the input signal and outputs a signal of a first power; and a second output route that is a circuit, which amplifies the input signal and outputs a signal of a second power, wherein the first output route includes: a first amplifier that amplifies the input signal; a first output matching circuit that is connected to an output node of the first amplifier; and a first switch element that is connected to an output node of the first output matching circuit, and the second output route includes: a second amplifier that amplifies the input signal; and a second switch element that is connected between an output node of the second amplifier and an output node of the first output matching circuit. Because the output node of the first output matching circuit in the first output route and the output node of the second amplifier in the second output route are connected to each other (through the switch element), a difference in output impedance corresponding to a difference in output power between the first amplifier and the second amplifier can be absorbed by the one output matching circuit (the first output matching circuit). Therefore, in the second output route, the necessity of the output matching circuit that converts the output impedance of the second amplifier is eliminated to reduce the circuit scale. Additionally, in the second output route, it is not necessary to provide the output matching circuit configured by the inductor and capacitor having the frequency characteristic. Therefore, the wide-band amplifier circuit is configured.

In an example of a relationship between the first power and the second power, preferably the first power is larger than the second power, each of the first amplifier and the second amplifier is configured by a transistor, and a cell size of the transistor constituting the first amplifier is larger than a cell size of the transistor constituting the second amplifier. At this point, an input impedance of the first output matching circuit may be lower than an input impedance of the second switch element, or each of the first switch element and the second switch element may configured by a transistor and a size of the first switch element may be larger than a size of the second switch element. The output impedance of the first output matching circuit is equalized to the output impedance of the second amplifier, and the output impedance of the first output matching circuit is matched with the output impedance of the second amplifier. Therefore, it is not necessary to provide the output matching circuit in the output node of the second amplifier.

Preferably the second switch element is configured by transistors that are connected in a plurality of stages. Specifically, preferably the second switch element is configured by connecting in series a plurality of circuits, each of which is configured by a transistor and a resistor being connected in parallel. Therefore, isolating can highly be maintained between the output terminal of the first output route and the second amplifier of the second output route, and the output efficiency is highly maintained during the output of the first power.

The high-frequency power amplifier may further include an input terminal to which the input signal is input, wherein the second output route may further include a third switch element that is connected between the input terminal and an input node of the second amplifier. At this point, preferably the first output route further includes a fourth switch element that is connected between the input terminal and an input node of the first amplifier. Therefore, the isolation can highly be maintained in the input node of the first output route and the input node of the second output route, and the input signal is surely input to the desired output route without losing the power.

The high-frequency power amplifier may further include an output terminal that is connected between the output node of the first switch element and the output node of the second switch element. At this point, preferably the high-frequency power amplifier further includes: an output terminal that outputs an output signal from the high-frequency power amplifier; and a capacitor that is connected between the output terminal and a connection point of the output node of the first switch element and the second switch element. Therefore, in the signal output from the first amplifier or second amplifier, only an AC component is output from the output terminal.

The high-frequency power amplifier may include the plurality of first output routes corresponding to different frequency bands. Therefore, the high-frequency power amplifier that is ready for the multiband and the two power outputs can be configured.

In the present invention, the circuit scale can be reduced in the high-frequency power amplifier that operates by selecting one of the plurality of output routes according to the required output power. Therefore, a practical value of the present invention is significantly high because the multiband mobile phone in which the plurality of output routes need to be switched in the high-frequency power amplifier is becoming increasingly common.

DESCRIPTION OF EMBODIMENTS

Hereinafter, a high-frequency power amplifier according to an embodiment of the present invention will be described with reference to the drawings.

First Exemplary Embodiment

Figure 1:
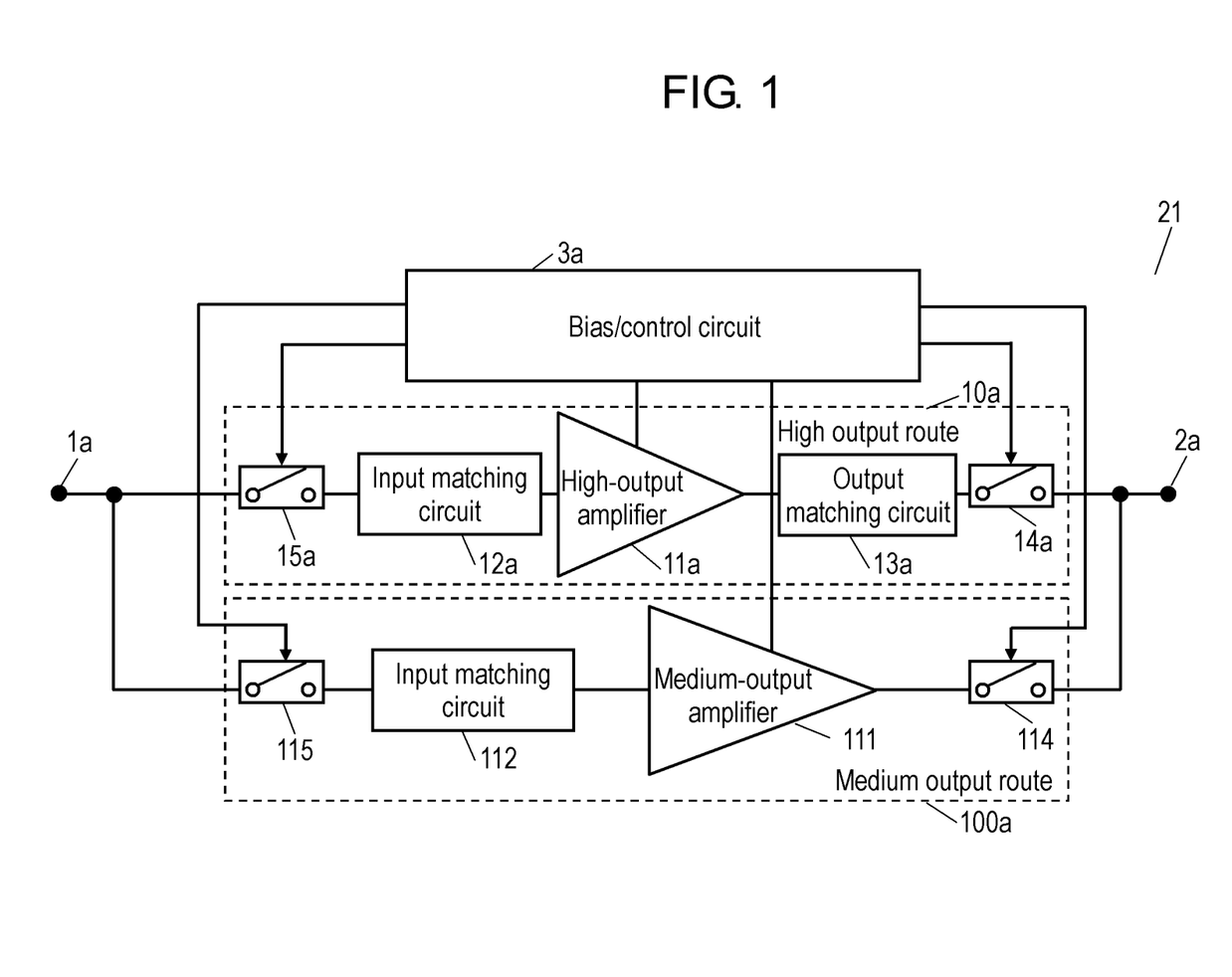
FIG. 1 is a block diagram of a high-frequency power amplifier according to a first embodiment of the present invention.
Figure 2:
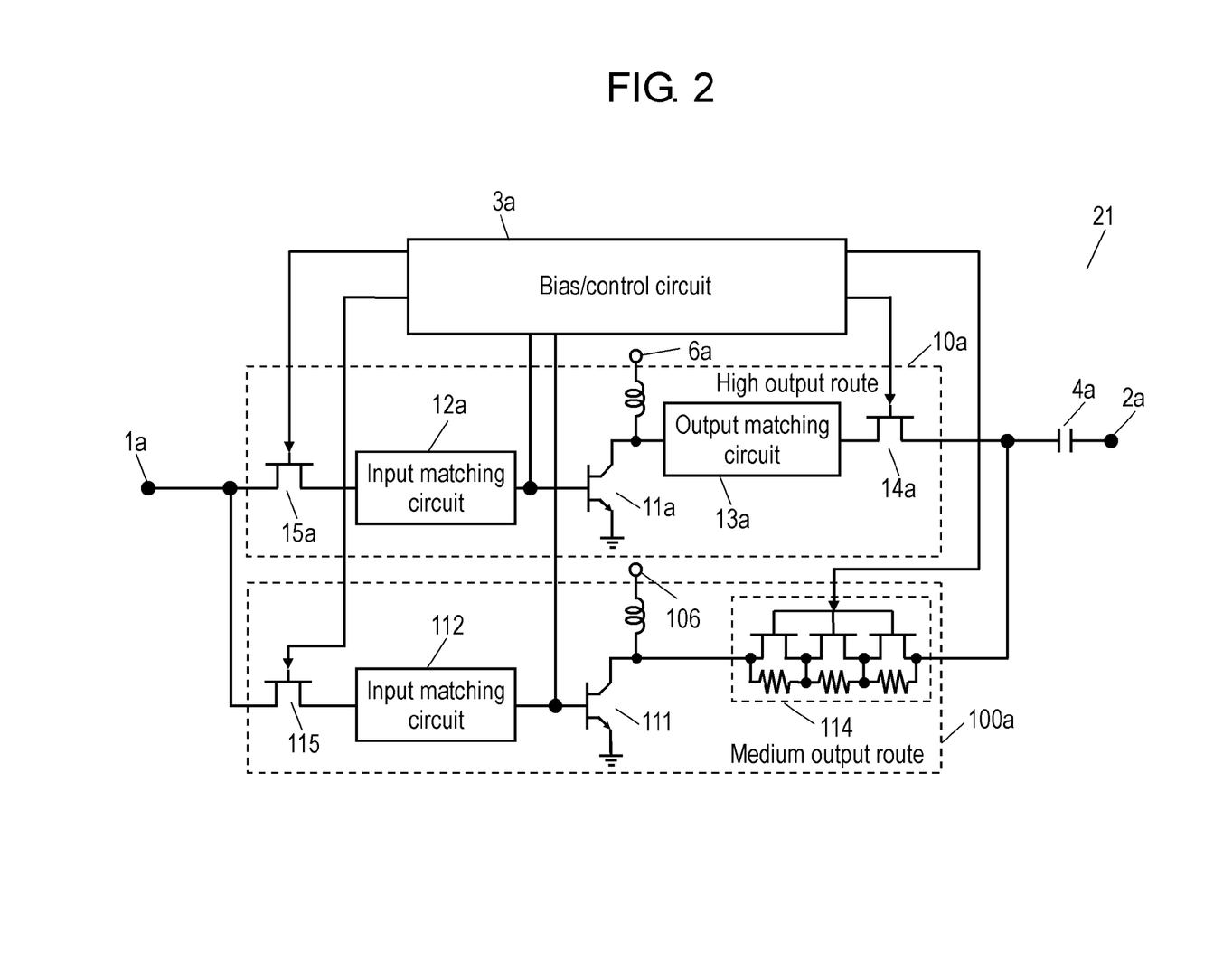
FIG. 2 is a circuit diagram of the high-frequency power amplifier according to the first embodiment of the present invention.

FIG. 1 is a block diagram of high-frequency power amplifier 21 according to a first embodiment of the present invention. FIG. 2 is a view illustrating an example of a circuit configuration of high-frequency power amplifier 21 of the first embodiment. High-frequency power amplifier 21 is the high-frequency power amplifier, which amplifies the high-frequency input signal and outputs the signal having one power selected from a plurality of powers. High-frequency power amplifier 21 includes input terminal 1a to which the input signal is input and high output route 10a that is the first output route. The first output route is the circuit, which amplifies the input signal input to input terminal 1a and outputs the signal having the first power (in this case, a high output power). High-frequency power amplifier 21 also includes medium output route 100a that is the second output route. The second output route is the circuit, which amplifies the input signal input to input terminal 1a and outputs the signal having the second power (in this case, a medium output power). High-frequency power amplifier 21 also includes output terminal 2a that selectively outputs the signals output from high output route 10a and medium output route 100a and bias/control circuit 3a that controls high output route 10a and medium output route 100a so as to selectively operate high output route 10a and medium output route 100a.

High output route 10a includes switch element 15a that is the fourth switch element connected to input terminal 1a, input matching circuit 12a that is connected to the output node of switch element 15a, and high-output amplifier 11a that is the first amplifier connected to the output node of input matching circuit 12a. High output route 10a also includes output matching circuit 13a that is the first output matching circuit connected to the output node of high-output amplifier 11a and switch element 14a that is the first switch element connected to the output node of output matching circuit 13a.

Medium output route 100a includes switch element 115 that is the third switch element connected to input terminal 1a and input matching circuit 112 that is connected to the output node of switch element 115. Medium output route 100a also includes medium-output amplifier 111 that is the second amplifier connected to the output node of input matching circuit 112 and switch element 114 that is the second switch element connected between the output node of medium-output amplifier 111 and the output node of output matching circuit 13a (in this case, switch element 14a).

Bias/control circuit 3a is a circuit that controls high output route 10a and medium output route 100a so as to selectively operate high output route 10a and medium output route 100a. Specifically, in the case that high output route 10a is operated, bias/control circuit 3a operates high-output amplifier 11a by supplying a proper bias current to high-output amplifier 11a, turns on switch elements 14a and 15a, and turns off other amplifiers and switch elements. On the other hand, in the case that medium output route 100a is operated, bias/control circuit 3a operates medium-output amplifier 111 by supplying the proper bias current to medium-output amplifier 111, turns on switch elements 114 and 115, and turns off other amplifiers and switch elements.

High-frequency power amplifier 21 of the first embodiment having the above configuration is operated as follows.

Next, the operation of high output route 10a will be described. In high output route 10a, the high-frequency power signal input from input terminal 1a is input to high-output amplifier 11a through switch element 15a and input matching circuit 12a. The high-frequency power signal amplified by high-output amplifier 11a is output from output terminal 2a through output matching circuit 13a and switch element 14a.

During the operation of high output route 10a, because of the control performed by bias/control circuit 3a, switch elements 14a and 15a and high-output amplifier 11a become an on-operation, and other switch elements and amplifiers are in an off-state. Bias/control circuit 3a is connected to a base terminal of high-output amplifier (HBT) 11a, and a current is supplied to the base of high-output amplifier 11a.

The operation of medium output route 100a will be described below. The high-frequency power signal input from input terminal 1a is input to medium-output amplifier 111 through switch element 115 and input matching circuit 112. The high-frequency power signal amplified by medium-output amplifier 111 is output from output terminal 2a through switch element 114.

During the operation of medium output route 100a, bias/control circuit 3a is connected to a base terminal of medium-output amplifier (HBT) 111, and the current is supplied to the base of medium-output amplifier 111. At this point, a cell size of medium-output amplifier 111 is optimized according to the output, and is smaller than that of high-output amplifier 11a. When the high-frequency power signal input from input terminal 1a is amplified by medium output route 100a, switch elements 115 and 114 and medium-output amplifier 111 become the on-operation, and other switch elements and amplifiers are in the off-state.

A size (specifically, a gate width of a transistor) of switch element 14a provided in high output route 10a is larger than that of switch element 114 provided in medium output route 100a in order to pass the larger power.

FIG. 2 illustrates a circuit of high-frequency power amplifier 21 of the first embodiment. Specifically, in this embodiment, a power output range of about 0 dBm to about 20 dBm is defined as "medium output", and a power output range of about 21 dBm to about 30 dBm is defined as "high output". Output terminal 2a has an output impedance of 50Ω, and is connected to a load (such as an antenna) of 50Ω.

In the first embodiment, high-output amplifier 11a is the HBT in which the output impedance is set to 5Ω using the bias current by the bias/control circuit 3a (setting of an operating point) during the operation. Output matching circuit 13a is an impedance converter, which includes an inductor and a capacitor, and has an input impedance of 5Ω and the output impedance of 50Ω. In the first embodiment, medium-output amplifier 111 is the HBT in which the output impedance is set to 50Ω using the bias current by the bias/control circuit 3a (the setting of the operating point) during the operation. A relationship of $P=V^2/Zout$ holds among output power P, amplitude voltage V of an output signal, and output impedance Zout in an amplifier, namely, an inversely proportional relationship holds between output power P and output impedance Zout when amplitude voltage V of the output signal is kept constant. Accordingly, in the first embodiment, the output impedance of high-output amplifier 11a is set to 5Ω, and the output impedance of medium-output amplifier 111 is set to 50Ω.

Thus in high-frequency power amplifier 21 of the first embodiment, an output matching circuit is not provided in the output node of medium-output amplifier 111, because the output impedance of medium-output amplifier 111 is set to 50Ω and matched with the output impedance (50Ω) of high-frequency power amplifier 21 (that is, the output matching circuit 13a). Therefore, the circuit scale of high-frequency power amplifier 21 is reduced because of the unnecessity of the output matching circuit in medium output route 100a.

In the first embodiment, switch elements 14a, 15a, and 115 are an FET. In the first embodiment, switch element 114 is configured by an FET that is connected at a plurality of stages (in this case, three stages). Specifically, in switch element 114, three circuits each of which is configured by a parallel connection of the FET and a resistor are connected in series. In FIG. 2, voltage power-off (AC coupling) capacitor 4a is connected between output terminal 2a and a connection point of switch element 14a and switch element 114.

Collector power supply terminal 6a supplies a voltage of 3.5 V to a collector of the HBT constituting high-output amplifier 11a. In the case that the high output power is obtained, switch element 114 becomes the off-state because bias/control circuit 3a applies a control signal of 0 V to a gate of each of the three FETs constituting switch element 114. Bias/control circuit 3a applies the control voltage of 3.5 V to the gate of the FET constituting switch element 14a, whereby switch element 14a performs the on-operation.

During the high output operation (that is, in the case that the power of 28 dBm is output), the signal having voltage amplitude of about 8 V is output to the output node of switch element 14a. Switch element 114 is configured by three depletion type FETs having a threshold of −0.7 V. That is, three parallel circuits each of which includes the FET and the resistor are connected in series as switch element 114 between voltage power-off capacitor 4a and medium-output amplifier 111. In switch element 114 having the above configuration, the output voltage of 8 V of the high output route is divided into three, and the divided voltage is applied between the source and drain of each FET constituting switch element 114, so that isolation can sufficiently be ensured between voltage power-off capacitor 4a and medium-output amplifier 111.

On the other hand, in the case that the medium output power is obtained, switch element 114 performs the on-operation because bias/control circuit 3a applies the control signal of 3.5 V to the gate of each of the three FETs constituting switch element 114. Bias/control circuit 3a applies the control voltage of 0 V to the gate of the FET constituting switch element 14a, whereby switch element 14a performs the off-operation. During the medium output operation (that is, in the case that the power of 18 dBm is output), the signal having the voltage amplitude of about 2.5 V is output to the output node of switch element 114. Switch element 14a is configured by the depletion type FETs having the threshold of −0.7 V. This is because the sufficient isolation can be ensured between voltage power-off capacitor 4a and high-output amplifier 11a when the one-stage FET is connected between voltage power-off capacitor 4a and high-output amplifier 11a.

As described above, in high-frequency power amplifier 21 of the first embodiment, the output matching circuit is not provided between medium-output amplifier 111 and output terminal 2a, because the output impedance of medium-output amplifier 111 constituting medium output route 100a is matched with the output impedance (50Ω) required for output terminal 2a. Therefore, the circuit scale of high-frequency power amplifier 21 of the first embodiment is smaller than that of the conventional high-frequency power amplifier in which the output matching circuit is provided in medium output route 100a. Additionally, in high-frequency power amplifier 21 of the first embodiment, it is not necessary to provide the output matching circuit having frequency dependence in medium output route 100a. Therefore, power efficiency is improved during the band widening and medium output.

Second Exemplary Embodiment

Figure 3:
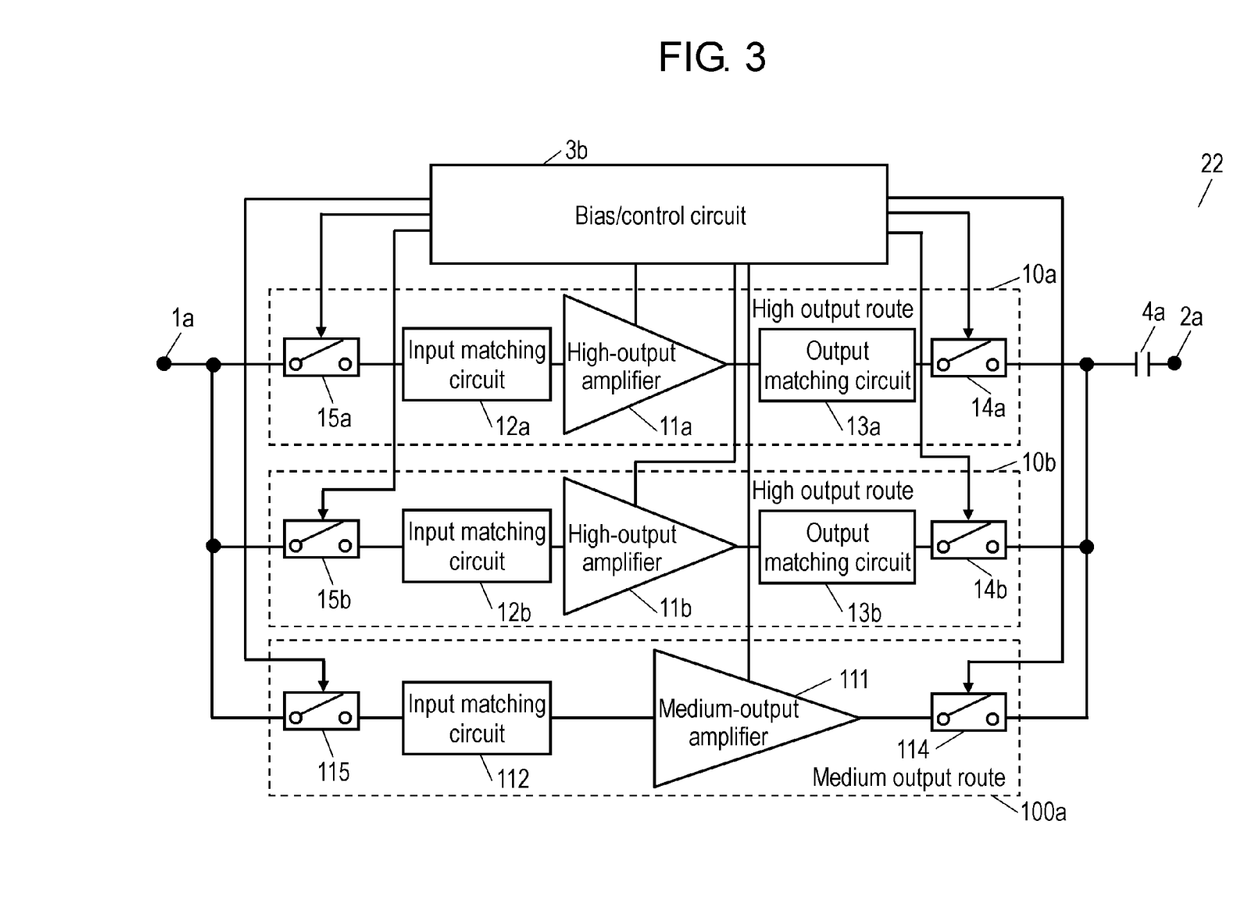
FIG. 3 is a block diagram of a high-frequency power amplifier according to a second embodiment of the present invention.
Figure 4:
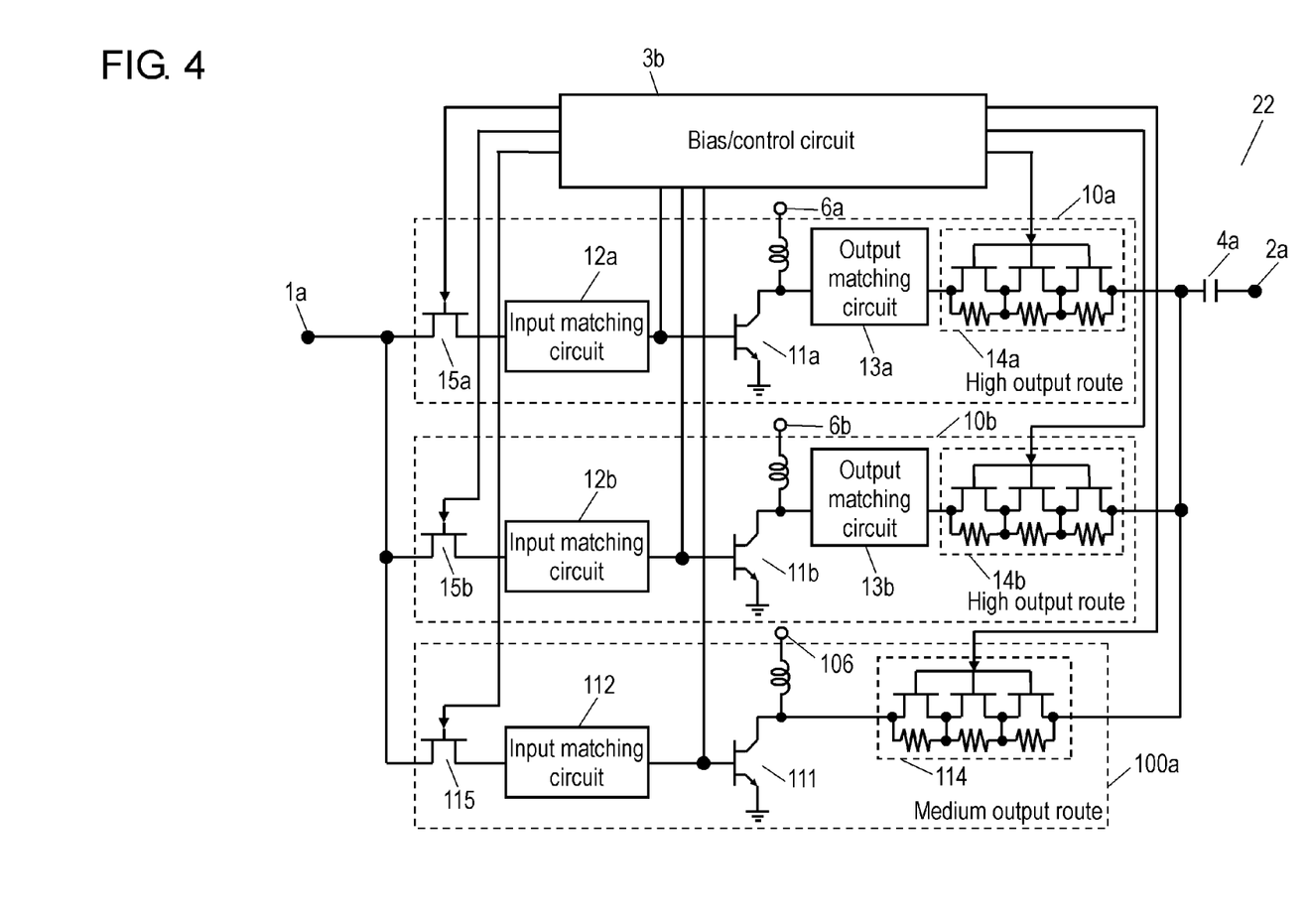
FIG. 4 is a circuit diagram of the high-frequency power amplifier according to the second embodiment of the present invention.

FIG. 3 is a block diagram of high-frequency power amplifier 22 according to a second embodiment of the present invention. FIG. 4 is a view illustrating an example of a circuit configuration of high-frequency power amplifier 22 of the second embodiment. Although high-frequency power amplifier 22 of the second embodiment basically includes the same configuration as high-frequency power amplifier 21 of the first embodiment, high-frequency power amplifier 22 differs from high-frequency power amplifier 21 of the first embodiment in that high-frequency power amplifier 22 includes two high output routes 10a and 10b corresponding to two different frequency bands. A point different from that of the first embodiment will be described below.

High output route 10b is a circuit that amplifies the signal having the frequency band different from that of high output route 10a. High output route 10b includes switch element 15b that is the fourth switch element connected to input terminal 1a, input matching circuit 12b that is connected to the output node of switch element 15b, and high-output amplifier 11b that is the first amplifier connected to the output node of input matching circuit 12b. High output route 10b also includes output matching circuit 13b that is the first output matching circuit connected to the output node of high-output amplifier 11b and switch element 14b that is the first switch element connected to the output node of output matching circuit 13b.

Medium output route 100a is a wide-band amplifier route for medium output, and can amplify the signals having the two frequency bands corresponding to two high output routes 10a and 10b.

Bias/control circuit 3b is a circuit that controls high output routes 10a and 10b and medium output route 100a so as to selectively operate high output routes 10a and 10b and medium output route 100a. Specifically, in the case that high output route 10b is operated, bias/control circuit 3b operates high-output amplifier 11b by supplying the proper bias current to high-output amplifier 11b, turns on switch elements 14b and 15b, and turns off other amplifiers and switch elements. The same as the first embodiment holds true for the case that high output route 10a is operated and the case that medium output route 100a is operated.

High-frequency power amplifier 22 of the second embodiment having the above configuration is operated as follows. The operation of the high output route will now be described. In high output route 10a, the high-frequency power signal input from input terminal 1a is input to high-output amplifier 11a through switch element 15a and input matching circuit 12a. The high-frequency power signal amplified by high-output amplifier 11a is output from output terminal 2a through output matching circuit 13a, switch element 14a, and voltage power-off capacitor 4a.

During the operation of high output route 10a, because of the control performed by bias/control circuit 3b, switch elements 15a and 14a and high-output amplifier 11a become the on-operation, and other switch elements and amplifiers are in the off-state. Bias/control circuit 3b is connected to the base terminal of high-output amplifier (HBT) 11a, and the current is supplied to the base of high-output amplifier 11a.

On the other hand, under the control of bias/control circuit 3b, high output route 10b is operated in the case that the high-frequency signal having the frequency different from that of high output route 10a is input to input terminal 1a. The high-frequency power signal is input to high-output amplifier 11b through switch element 15b and input matching circuit 12b. The high-frequency power signal amplified by high-output amplifier 11b is output from output terminal 2a through output matching circuit 13b, switch element 14b, and voltage power-off capacitor 4a in turn.

During the operation of high output route 10b, because of the control performed by bias/control circuit 3b, switch elements 15b and 14b and high-output amplifier 11b become the on-operation, and other switch elements and amplifiers are in the off-state. Bias/control circuit 3b is connected to the base terminal of high-output amplifier (HBT) 11b, and the current is supplied to the base of high-output amplifier 11b.

The operation of medium output route 100a will be described below. The high-frequency power signal input from input terminal 1a is input to medium-output amplifier 111 through switch element 115 and input matching circuit 112. The high-frequency power signal amplified by medium-output amplifier 111 is output from output terminal 2a through switch element 114 and voltage power-off capacitor 4a.

During the operation of medium output route 100a, bias/control circuit 3b is connected to the base terminal of medium-output amplifier (HBT) 111, and the current is supplied to the base of medium-output amplifier 111. At this point, the cell size of medium-output amplifier 111 is optimized according to the output, and is smaller than that of high-output amplifiers 11a and 11b. When the high-frequency power signal input from input terminal 1a is amplified by medium output route 100, switch elements 115 and 114 and medium-output amplifier 111 become the on-operation, and other switch elements and amplifiers are in the off-state. That is, when the medium output route 100a is operated, switch elements 115 and 114 and medium-output amplifier 111 become the on-state and other switch elements and amplifiers are in the off-state, even if the high-frequency signal having the frequency corresponding to high output route 10a is input to input terminal 1a, and even if the high-frequency signal having the frequency corresponding to high output route 10b is input to input terminal 1a.

FIG. 4 illustrates a circuit of high-frequency power amplifier 22 of the second embodiment of the present invention. Specifically, in this embodiment, the power output range of about 0 dBm to about 20 dBm is defined as the "medium output", and the power output range of about 21 dBm to about 30 dBm is defined as the "high output". Output terminal 2a has the output impedance of 50Ω, and is connected to the load (such as an antenna) of 50Ω.

In the second embodiment, high-output amplifier 11b is the HBT in which the output impedance is set to 5Ω using the bias current by the bias/control circuit 3b (the setting of the operating point) during the operation. Output matching circuit 13b is the impedance converter, which includes the inductor and the capacitor, and has the input impedance of 5Ω and the output impedance of 50Ω.

In the second embodiment, each of switch elements 15a and 15b is configured by one FET, and each of switch elements 14a and 14b is configured by FETs connected at a plurality of stages (in this case, three stages) like switch element 114.

Collector power supply terminals 6a and 6b supply the voltage of 3.5 V to the collectors of the HBTs constituting high-output amplifiers 11a and 11b. In the case that the high output power is obtained, switch element 114 becomes the off-state because bias/control circuit 3b applies the control signal of 0 V to the gate of each of the three FETs constituting switch element 114. Bias/control circuit 3b selectively (one of switch elements 14a and 14b) applies the control voltage of 3.5 V to the gates of the three FETs constituting each of switch elements 14a and 14b according to the frequency of the input signal, whereby switch element 14a or 14b performs the on-operation.

During the high output operation (that is, in the case that the power of 28 dBm is output) performed by high output route 10a, the signal having the voltage amplitude of about 8 V is output to the output node of switch element 14a. Switch element 114 is configured by the three depletion type FETs having the threshold of −0.7 V. That is, three parallel circuits each of which includes the FET and the resistor are connected in series as switch element 114 between voltage power-off capacitor 4a and medium-output amplifier 111. In switch element 114 having the above configuration, the output voltage of 8 V of the high output route is divided into three, and the divided voltage is applied between the source and drain of each FET constituting switch element 114, so that the isolation can sufficiently be ensured between voltage power-off capacitor 4a and medium-output amplifier 111. Thus, in the case that high output route 10a is operated, high output route 10b is in the off-state like medium output route 100a. Like switch element 114, switch element 14b has the configuration in which the three parallel circuits, each of which includes the FET and the resistor, are connected in series. Therefore, the isolation can sufficiently be ensured between voltage power-off capacitor 4a and high-output amplifier 11b.

Because the operation of high output route 10b is identical to that of high output route 10a except that the frequency different from that of high output route 10a is input, the description of the operation of high output route 10b is omitted.

On the other hand, in the case that the medium output power is obtained, switch element 114 performs the on-operation because bias/control circuit 3b applies the control signal of 3.5 V to the gate of each of the three FETs constituting switch element 114. Bias/control circuit 3b applies the control voltage of 0 V to the gate of each of the three FETs constituting switch element 14a and to the gate of each of the three FETs constituting switch element 14b, whereby switch elements 14a and 14b perform the off-operation. During the medium output operation (that is, in the case that the power of 18 dBm is output), the signal having the voltage amplitude of about 2.5 V is output to the output node of switch element 114. Each of switch elements 14a and 14b is configured by the three depletion type FETs having the threshold of −0.7 V. Thus, the three-stage FET is connected between voltage power-off capacitor 4a and high-output amplifier 11a and the three-stage FET is also connected between voltage power-off capacitor 4a and high-output amplifier 11b. Therefore, the isolation can efficiently be ensured between these components.

In high-frequency power amplifier 22 of the second embodiment, there is no limitation to the frequency of the signal amplified by medium output route 100a because the matching circuit, which is configured by the capacitance or inductor and connected to the collector of medium-output amplifier (transistor) 111, is eliminated in medium output route 100a. Therefore, medium output route 100a can amplify not only the signal having the frequency corresponding to high output route 10a but also the signal having the frequency corresponding to high output route 10b, so that medium output route 100a can be used in the wide band.

Third Exemplary Embodiment

Figure 5:
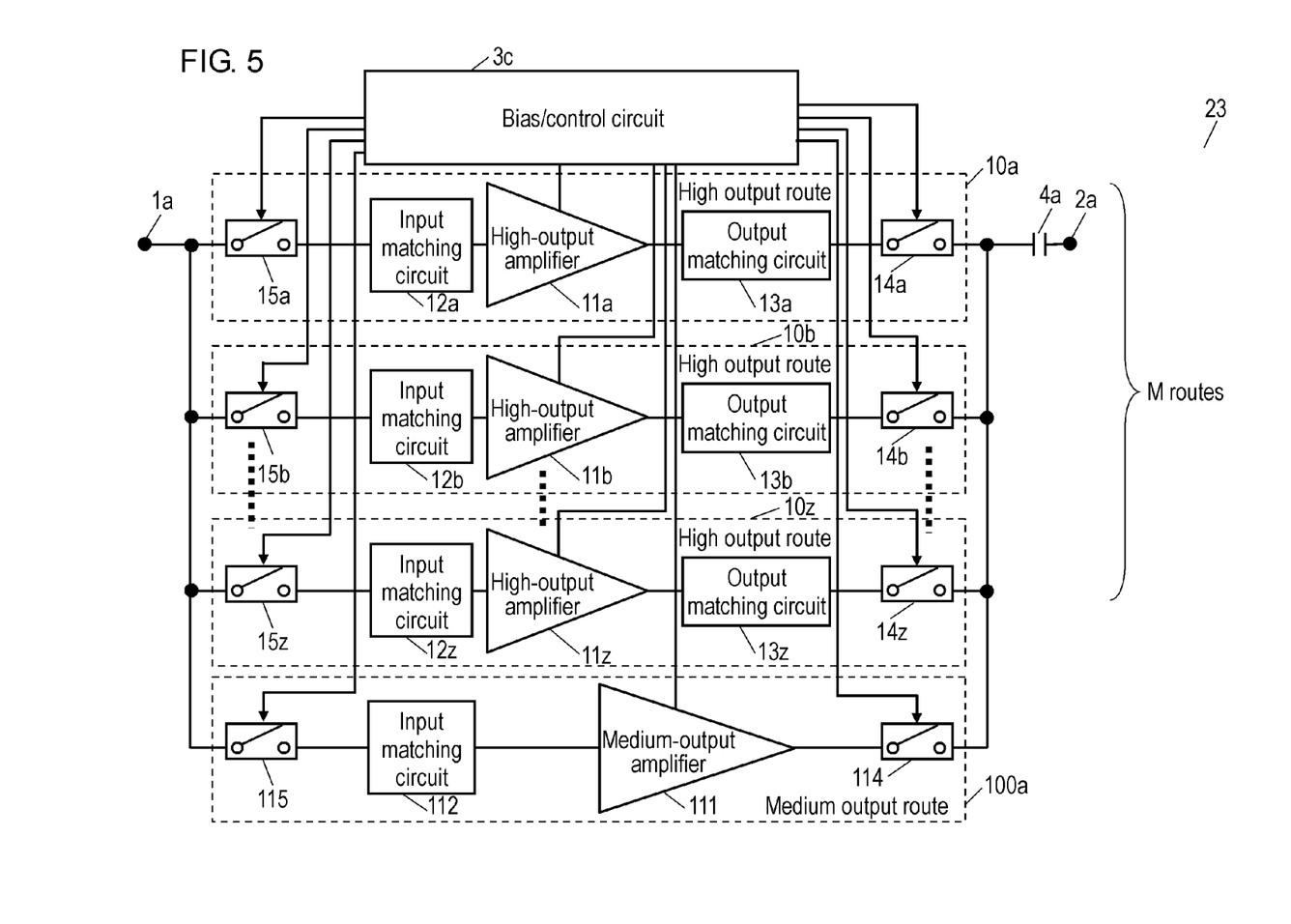
FIG. 5 is a block diagram of a high-frequency power amplifier according to a third embodiment of the present invention.

FIG. 5 is a block diagram of high-frequency power amplifier 23 according to a third embodiment of the present invention. High-frequency power amplifier 23 of the third embodiment basically includes the same configuration as high-frequency power amplifier 21 of the first embodiment and high-frequency power amplifier 22 of the second embodiment. However, high-frequency power amplifier 23 differs from high-frequency power amplifier 21 including one high output route in the first embodiment and high-frequency power amplifier 22 including two high output routes in the second embodiment in that high-frequency power amplifier 23 includes M (≥3) high output routes 10a, 10b, ..., and 10z corresponding to M different frequency bands. That is, the configuration of the third embodiment differs from those of the first and second embodiments in the number of high output routes.

Accordingly, the high-frequency signals having the frequencies different from one another are input to high-output amplifiers 11a, 11b, ..., and 11z of the high output route.

Medium output route 100a is the wide-band amplifier route for the medium output, and can amplify the signals having the M frequency bands corresponding to M high output routes 10a, 10b, ..., and 10z.

Bias/control circuit 3c is a circuit that controls high output routes 10a, 10b, ..., and 10z and medium output route 100a so as to selectively operate high output routes 10a, 10b, ..., and 10z and medium output route 100a. The third embodiment differs from the second embodiment only in that the number of high output routes of control targets increases.

The operation of high-frequency power amplifier 23 of the third embodiment having the above configuration is identical to that of the second embodiment except that the number of high output routes increases. Therefore, the description of the operation of high-frequency power amplifier 23 is omitted.

Fourth Exemplary Embodiment

Figure 6:
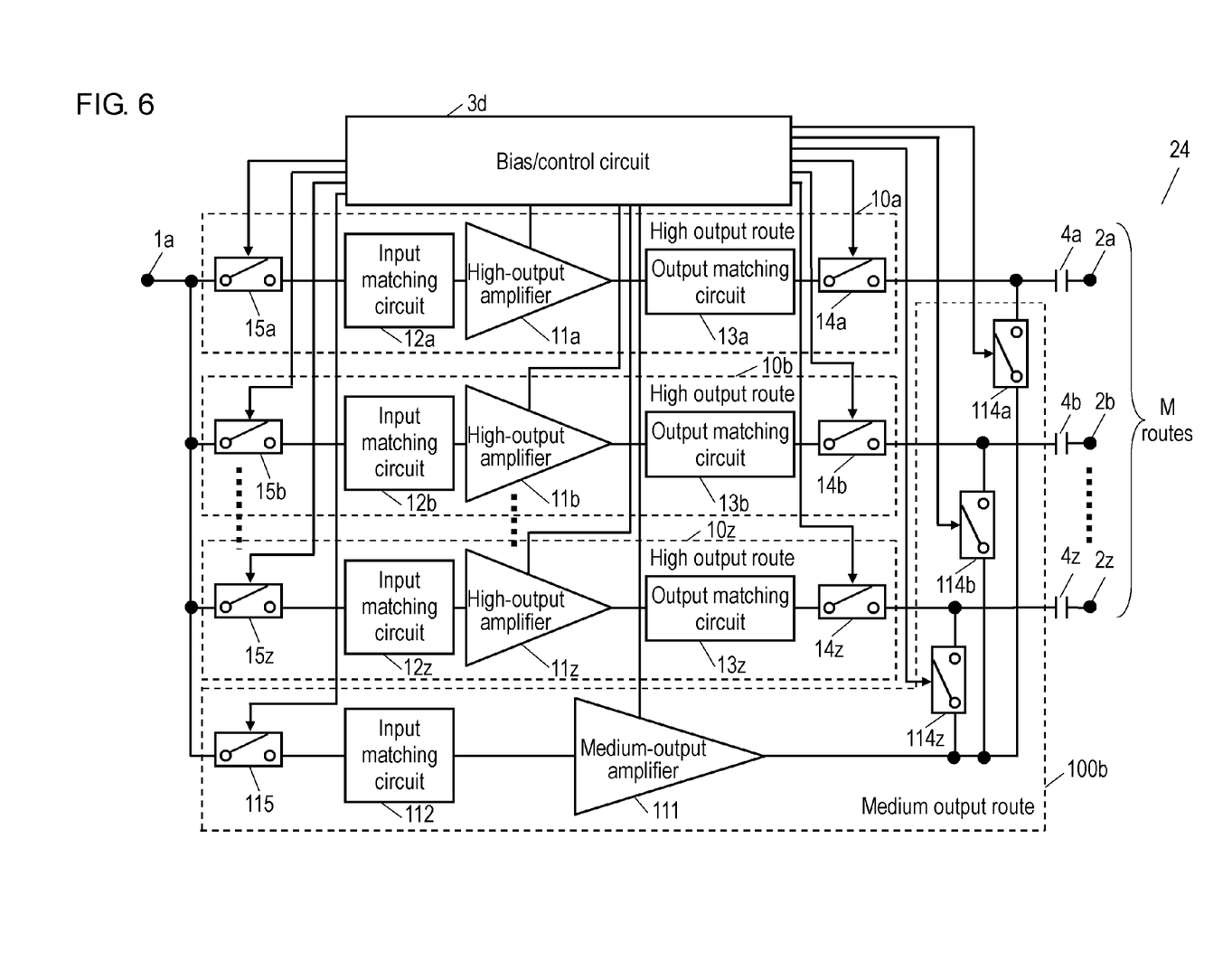
FIG. 6 is a block diagram of a high-frequency power amplifier according to a fourth embodiment of the present invention.

FIG. 6 is a block diagram of high-frequency power amplifier 24 according to a fourth embodiment of the present invention. High-frequency power amplifier 24 of the fourth embodiment basically includes the same configuration as high-frequency power amplifier 23 of the third embodiment. However, high-frequency power amplifier 24 differs from high-frequency power amplifier 23 including one output terminal 2a in the third embodiment in that high-frequency power amplifier 24 includes M output terminals 2a, 2b, ..., and 2z corresponding to high output routes 10a, 10b, ..., and 10z (that is, M different frequency bands). The configuration of the fourth embodiment differs from that of the third embodiment in the number of output terminals.

Like medium output route 100a of the third embodiment, medium output route 100b is the wide-band amplifier route for the medium output that can amplify the signals of the M frequency bands corresponding to M high output routes 10a, 10b, ..., and 10z. However, medium output route 100b differs from medium output route 100a of the third embodiment in that medium output route 100b includes M switch elements 114a, 114b, ..., and 114z corresponding to M output terminals 2a, 2b, ..., and 2z.

Bias/control circuit 3d is a circuit that controls high output routes 10a, 10b, ..., and 10z and medium output route 100b so as to selectively operate high output routes 10a, 10b, ..., and 10z and medium output route 100b. In the case that medium output route 100b is operated, in addition to the control of the third embodiment, bias/control circuit 3d performs control so as to turn on corresponding one of switch elements 114a, 114b, ..., and 114z according to the input frequency (one of the M frequency bands).

The operation of high-frequency power amplifier 24 of the fourth embodiment having the above configuration is identical to that of the third embodiment except that the control to turn on corresponding one of switch elements 114a, 114b, ..., and 114z is added in the case that medium output route 100b is selected. Therefore, the description of the operation of high-frequency power amplifier 24 is omitted.

Fifth Exemplary Embodiment

Figure 7:
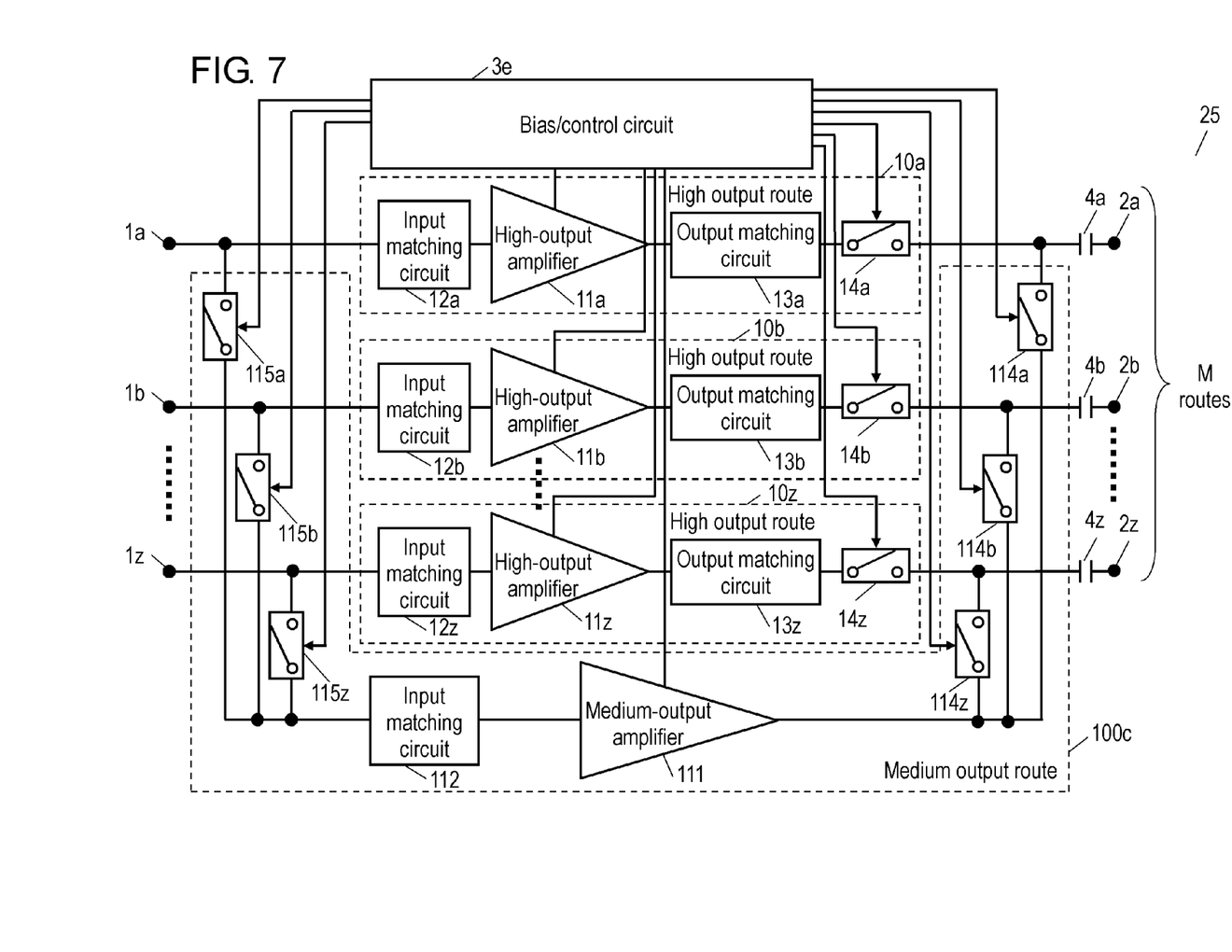
FIG. 7 is a block diagram of a high-frequency power amplifier according to a fifth embodiment of the present invention.

FIG. 7 is a block diagram of high-frequency power amplifier 25 according to a fifth embodiment of the present invention. High-frequency power amplifier 25 of the fifth embodiment basically includes the same configuration as high-frequency power amplifier 24 of the fourth embodiment. However, high-frequency power amplifier 25 differs from high-frequency power amplifier 24 including one input terminal 1a in the fourth embodiment in that high-frequency power amplifier 25 includes M input terminals 1a, 1b, ..., and 1z corresponding to high output routes 10a, 10b, ..., and 10z (that is, the M different frequency bands). The configuration of the fifth embodiment differs from that of the fourth embodiment in the number of input terminals.

Like medium output route 100b of the fourth embodiment, medium output route 100c is the wide-band amplifier route for the medium output that can amplify the signals of the M frequency bands corresponding to M high output routes 10a, 10b, ..., and 10z. However, medium output route 100c differs from medium output route 100b of the fourth embodiment in that medium output route 100c includes M switch elements 115a, 115b, ..., and 115z corresponding to M input terminals 1a, 1b, ..., and 1z.

Bias/control circuit 3e is a circuit that controls high output routes 10a, 10b, ..., and 10z and medium output route 100c so as to selectively operate high output routes 10a, 10b, ..., and 10z and medium output route 100c. In the case that medium output route 100c is operated, in addition to the control of the fourth embodiment, bias/control circuit 3e performs control so as to turn on corresponding one of switch elements 115a, 115b, ..., and 115z according to the input frequency (one of the M frequency bands).

The operation of high-frequency power amplifier 25 of the fifth embodiment having the above configuration is identical to that of the fourth embodiment except that the control to turn on corresponding one of switch elements 115a, 115b, ..., and 115z is added in the case that medium output route 100c is selected. Therefore, the description of the operation of high-frequency power amplifier 25 is omitted.

Sixth Exemplary Embodiment

Figure 8:
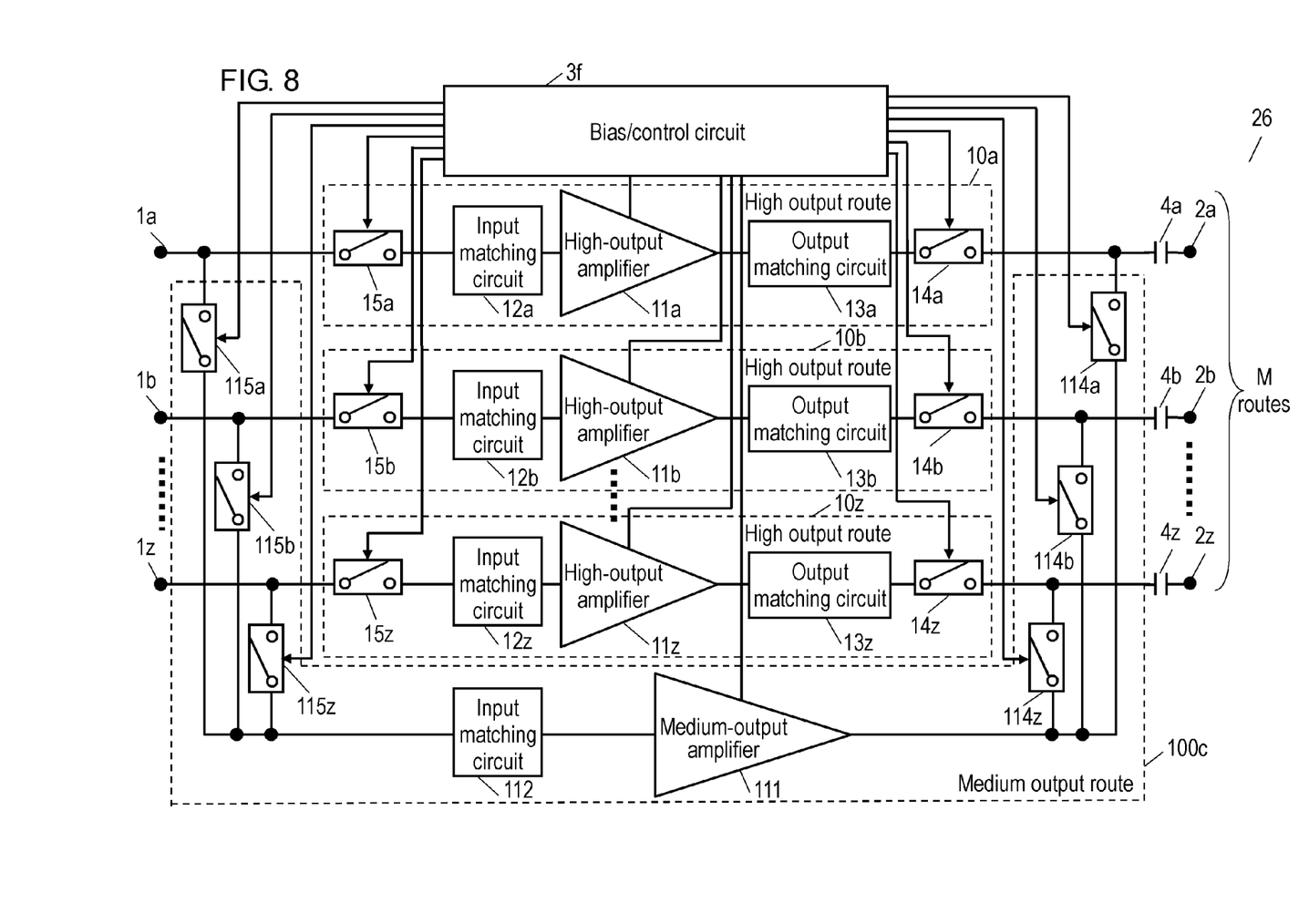
FIG. 8 is a block diagram of a high-frequency power amplifier according to a sixth embodiment of the present invention.

FIG. 8 is a block diagram of high-frequency power amplifier 26 according to a sixth embodiment of the present invention. High-frequency power amplifier 26 of the sixth embodiment basically includes the same configuration as high-frequency power amplifier 25 of the fifth embodiment. However, high-frequency power amplifier 26 differs from high-frequency power amplifier 25 of the fifth embodiment in which high output routes 10a, 10b, ..., and 10z include no input switch elements in that high output routes 10a, 10b, ..., and 10z include M input switch elements 15a, 15b, ..., and 15z, respectively. In the sixth embodiment, switch elements 15a, 15b, ..., and 15z are connected between input terminals 1a, 1b, ..., and 1z and input matching circuits 12a, 12b, ..., and 12z of high output routes 10a, 10b, ..., and 10z in order to improve the isolation between high output routes 10a, 10b, ..., and 10z and medium output routes 100c, respectively.

Bias/control circuit 3f is a circuit that controls high output routes 10a, 10b, ..., and 10z and medium output route 100c so as to selectively operate high output routes 10a, 10b, ..., and 10z and medium output route 100c. In the case that high output routes 10a, 10b, ..., and 10z are operated, in addition to the control of the fifth embodiment, bias/control circuit 3f performs control so as to turn on corresponding one of switch elements 15a, 15b, ..., and 15z according to the input frequency (one of the M frequency bands).

The operation of high-frequency power amplifier 26 of the sixth embodiment having the above configuration is identical to that of the fifth embodiment except that the control to turn on corresponding one of switch elements 15a, 15b, . . . , and 15z is added in the case that high output routes 10a, 10b, . . . , and 10z are selected. Therefore, the description of the operation of high-frequency power amplifier 26 is omitted.

Although the high-frequency power amplifiers according to the first to sixth embodiments of the present invention are described above, the present invention is not limited to the first to sixth embodiments. Various modifications, by a person skilled in the art, of each embodiment and any combination of constituents of each embodiment are also included in the present invention without departing from the scope of the invention.

In the embodiments, the high-frequency power amplifier includes the high output route and the medium output route. Alternatively, the high-frequency power amplifier may include the low output route like the conventional high-frequency power amplifier. The low output route may have the same configuration as the conventional low output route or the same configuration (the configuration that does not include the output matching circuit) as the medium output route of each of the embodiments.

In the embodiments, the high-output amplifier has the output impedance of 5Ω, the output matching circuit in the high output route has the input impedance of 5Ω, the output matching circuit in the high output route has the output impedance of 50Ω, and the medium-output amplifier has the output impedance of 50Ω. However, the present invention is not limited to the above impedance values. For example, the output matching circuit in the high output route and the medium-output amplifier may have the output impedance of 75Ω. As long as the output impedance of the output matching circuit in the high output route is matched with the output impedance of the medium-output amplifier, the necessity of the output matching circuit in the medium output route is eliminated to achieve the object of the present invention.

The present invention implements the band widening and high efficiency of the high-frequency power amplifier, particularly in the medium output route, so that the present invention is useful as the high-frequency power amplifier used in the mobile-communication transmitting device including the mobile phone.

What is claimed is:

1. A high-frequency power amplifier that amplifies a high-frequency input signal and outputs a signal having one power selected from a plurality of powers, the high-frequency power amplifier comprising:
a first output route that is a circuit, which amplifies the input signal and outputs a signal of a first power; and
a second output route that is a circuit, which amplifies the input signal and outputs a signal of a second power,
wherein the first output route includes:
a first amplifier that amplifies the input signal;
a first output matching circuit that is connected to an output node of the first amplifier; and
a first switch element that is connected to an output node of the first output matching circuit, and
the second output route includes:
a second amplifier that amplifies the input signal; and
a second switch element that is connected between an output node of the second amplifier and an output node of the first switch element,
each of the first switch element and the second switch element comprises a transistor, and
a size of the first switch element is larger than a size of the second switch element.

2. The high-frequency power amplifier according to claim 1,
wherein the first power is larger than the second power,
each of the first amplifier and the second amplifier comprises a transistor, and
a cell size of the transistor constituting the first amplifier is larger than a cell size of the transistor constituting the second amplifier.

3. The high-frequency power amplifier according to claim 1,
wherein an input impedance of the first output matching circuit is lower than an input impedance of the second switch element.

4. The high-frequency power amplifier according to claim 1,
wherein an output impedance of the first output matching circuit is equal to an output impedance of the second amplifier.

5. The high-frequency power amplifier according to claim 1, further comprising an output terminal that is connected between the output node of the first switch element and an output node of the second switch element.

6. The high-frequency power amplifier according to claim 1, further comprising:
an output terminal that outputs an output signal from the high-frequency power amplifier; and
a capacitor that is connected between the output terminal and a connection point of the output node of the first switch element and the second switch element.

7. The high-frequency power amplifier according to claim 1, comprising a plurality of first output routes, each of which is identical to the first output route, corresponding to different frequency bands.

8. The high-frequency power amplifier according to claim 1,
wherein the first amplifier is connected to an output terminal through the first output matching circuit and the first switch element, and the second amplifier is connected to the output terminal through the second switch element.

9. The high-frequency power amplifier according to claim 1, further comprising an input terminal to which the input signal is input,
wherein the second output route further includes a third switch element that is connected between the input terminal and an input node of the second amplifier.

10. The high-frequency power amplifier according to claim 9,
wherein the first output route further includes a fourth switch element that is connected between the input terminal and an input node of the first amplifier.

11. A high-frequency power amplifier that amplifies a high-frequency input signal and outputs a signal having one power selected from a plurality of powers, the high-frequency power amplifier comprising:
a first output route that is a circuit, which amplifies the input signal and outputs a signal of a first power; and
a second output route that is a circuit, which amplifies the input signal and outputs a signal of a second power,
wherein the first output route includes:
a first amplifier that amplifies the input signal;
a first output matching circuit that is connected to an output node of the first amplifier; and
a first switch element that is connected to an output node of the first output matching circuit, and
the second output route includes:
a second amplifier that amplifies the input signal; and
a second switch element that is connected between an output node of the second amplifier and an output node of the first switch element, wherein the second switch element comprises transistors that are connected in a plurality of stages.

12. The high-frequency power amplifier according to claim 11,
wherein the second switch element comprises a plurality of circuits being connected in series, each of the plurality of circuits comprises a transistor and a resistor being connected in parallel.

13. The high-frequency power amplifier according to claim 11, further comprising an input terminal to which the input signal is input,
wherein the second output route further includes a third switch element that is connected between the input terminal and an input node of the second amplifier.

14. The high-frequency power amplifier according to claim 13, wherein the first output route further includes a fourth switch element that is connected between the input terminal and an input node of the first amplifier.

15. A high-frequency power amplifier that amplifies a high-frequency input signal and outputs a signal having one power selected from a plurality of powers, the high-frequency power amplifier comprising:
a first output route that is a circuit, which amplifies the input signal and outputs a signal of a first power; and
a second output route that is a circuit, which amplifies the input signal and outputs a signal of a second power,
wherein the first output route includes:
a first amplifier that amplifies the input signal;
a first output matching circuit that is connected to an output node of the first amplifier; and
a first switch element that is connected to an output node of the first output matching circuit,
the second output route includes:
a second amplifier that amplifies the input signal; and
a second switch element that is connected between an output node of the second amplifier and an output node of the first switch element, and
an input terminal to which the input signal is input,
wherein the second output route further includes a third switch element that is connected between the input terminal and an input node of the second amplifier.

16. The high-frequency power amplifier according to claim 15,
wherein the first output route further includes a fourth switch element that is connected between the input terminal and an input node of the first amplifier.

17. A high-frequency power amplifier that amplifies a high-frequency input signal and outputs a signal having one power selected from a plurality of powers, the high-frequency power amplifier comprising:
a first output route that is a circuit, which amplifies the input signal and outputs a signal of a first power; and
a second output route that is a circuit, which amplifies the input signal and outputs a signal of a second power,
wherein the first output route includes:
a first amplifier that amplifies the input signal;
a first output matching circuit that is connected to an output node of the first amplifier; and
a first switch element that is connected to an output node of the first output matching circuit, and
the second output route includes:
a second amplifier that amplifies the input signal; and
a second switch element that is connected between an output node of the second amplifier and an output node of the first switch element,
wherein an output impedance of the first amplifier is about $5\Omega$, an input impedance of the first output matching circuit in the first output route is about $5\Omega$, an output impedance of the first output matching circuit in the first output route is about $50\Omega$, and an output impedance of the second amplifier is about $50\Omega$.

18. The high-frequency power amplifier according to claim 17, further comprising an input terminal to which the input signal is input,
wherein the second output route further includes a third switch element that is connected between the input terminal and an input node of the second amplifier.

19. The high-frequency power amplifier according to claim 18,
wherein the first output route further includes a fourth switch element that is connected between the input terminal and an input node of the first amplifier.

* * * * *